(12) United States Patent
Boescke

(10) Patent No.: US 7,791,149 B2
(45) Date of Patent: Sep. 7, 2010

(54) INTEGRATED CIRCUIT INCLUDING A DIELECTRIC LAYER

(75) Inventor: Tim Boescke, Dresden (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 12/170,967

(22) Filed: Jul. 10, 2008

(65) Prior Publication Data
US 2010/0006953 A1 Jan. 14, 2010

(51) Int. Cl.
H01L 29/76 (2006.01)
H01L 29/94 (2006.01)
(52) U.S. Cl. .......... 257/410; 257/411; 257/E27.06
(58) Field of Classification Search ........ 257/410, 257/411, E27.06
See application file for complete search history.

(56) References Cited

U.S. PATENT DOCUMENTS

| 7,265,427 | B2 * | 9/2007 | Kaneko et al. | 257/410 |
| 7,375,403 | B2 * | 5/2008 | Kaneko et al. | 257/410 |
| 2007/0272967 | A1 * | 11/2007 | Pantisano et al. | 257/315 |
| 2007/0278587 | A1 * | 12/2007 | Aoyama et al. | 257/369 |
| 2008/0054378 | A1 * | 3/2008 | Kaneko et al. | 257/410 |
| 2008/0124460 | A1 * | 5/2008 | Athey et al. | 427/165 |
| 2008/0191286 | A1 * | 8/2008 | Chang et al. | 257/369 |
| 2008/0230838 | A1 * | 9/2008 | Ohara | 257/350 |
| 2008/0265324 | A1 * | 10/2008 | Kaneko et al. | 257/347 |
| 2009/0014818 | A1 * | 1/2009 | Nomachi | 257/412 |
| 2009/0050982 | A1 * | 2/2009 | Pantisano et al. | 257/411 |
| 2009/0057737 | A1 | 3/2009 | Boescke et al. | |
| 2009/0072329 | A1 * | 3/2009 | Kiyomura et al. | 257/411 |
| 2009/0080260 | A1 * | 3/2009 | Jenne | 365/185.18 |
| 2009/0085175 | A1 * | 4/2009 | Clark et al. | 257/637 |
| 2009/0086538 | A1 * | 4/2009 | Jenne et al. | 365/185.02 |
| 2009/0114996 | A1 * | 5/2009 | Inumiya et al. | 257/369 |
| 2009/0152621 | A1 * | 6/2009 | Polishchuk et al. | 257/325 |
| 2009/0152640 | A1 * | 6/2009 | Hase | 257/369 |
| 2009/0267158 | A1 * | 10/2009 | Hase | 257/369 |

* cited by examiner

Primary Examiner—Ngan Ngo
(74) Attorney, Agent, or Firm—Dicke, Billig & Czaja, PLLC

(57) ABSTRACT

An integrated circuit including a dielectric layer and a method for manufacturing. One embodiment provides a substrate having a first side and a second side and at least one dielectric layer. The dielectric layer includes a zirconium oxide and at least one dopant selected from the group consisting of hafnium and titanium and having a first side and a second side. The first side of the dielectric layer is arranged at least on a subarea of the first side of the semiconductor substrate.

14 Claims, 7 Drawing Sheets

_US 7,791,149 B2_

INTEGRATED CIRCUIT INCLUDING A DIELECTRIC LAYER

BACKGROUND

Demands imposed on large scale integrated circuits, such as electronic memory devices, microprocessors, signal-processors and integrated logic devices, are constantly increasing. In the case of electronic memory devices, those demands mainly translate into enlarging storage capacity and into increasing access speed. As far as modern memory devices are concerned, the computer industry has established, amongst others, the DRAM (Dynamic Random Access Memory) as an economic means for high speed and high capacity data storage.

Although a DRAM requires continuous refreshing of stored information, speed and information density, combined with a relatively low cost, have put the DRAM to a pivotal position in the field of information technology. Almost every type of computer system, ranging, for example, from PDAs over note-book computers and personal computers to high-end servers, takes advantage of this economic and fast data storage technology. Nevertheless, the computer and electronic industry develops alternatives to the DRAM, such as phase change RAM (PC-RAM), conductive bridging RAM (CB-RAM), and magnetic resistive RAM (M-RAM). Other concepts include the flash-RAM or static RAM (S-RAM), which have already found their established applications.

In order to increase the storage capacity of, for example, a memory device, the computer industry aims to reduce the minimum feature size. This translates into a miniaturization of the involved electronic entities, such as transistors, capacitors, resistors, and/or signal lines. Hereby, many electronic entities involve a dielectric element or a dielectric layer. Examples include a transistor, which includes a gate-electrode, separated from a transistor channel by a dielectric layer. Furthermore, a capacitor includes a dielectric layer which is arranged in between two facing electrodes. Often, it is desirable to maximize the dielectric constant of the dielectric material of the dielectric element and/or dielectric layer. This may result into an enhanced capacity, while, at the same time, being able to reduce the feature and/or electrode area. Also, it may be desirable to reduce leakage currents through the dielectric material of a dielectric element and/or layer.

As part of efforts to increase the dielectric constant of a dielectric material, the high-k-materials are subject to intense industrial and scientific research. Such materials may be defined as having a dielectric constant which is greater than the dielectric constant of silicon dioxide. Examples for high-k-materials include transition metal oxides, zirconium, hafnium-oxide, lead zirconium titanate, tantalum oxide, silicon nitride, and/or barium strontium titanate. However, there is still need for increasing the dielectric constant of dielectric materials, dielectric elements, and/or dielectric layers.

For these and other reasons, there is a need for the present invention.

SUMMARY

One embodiment provides an integrated circuit including a substrate having a first side and a second side and at least one dielectric layer, the dielectric layer including a zirconium oxide and at least one dopant selected from a group including hafnium and titanium and having a first side and a second side, wherein the first side of the dielectric layer is arranged at least on a subarea of the first side of the semiconductor substrate.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1A:
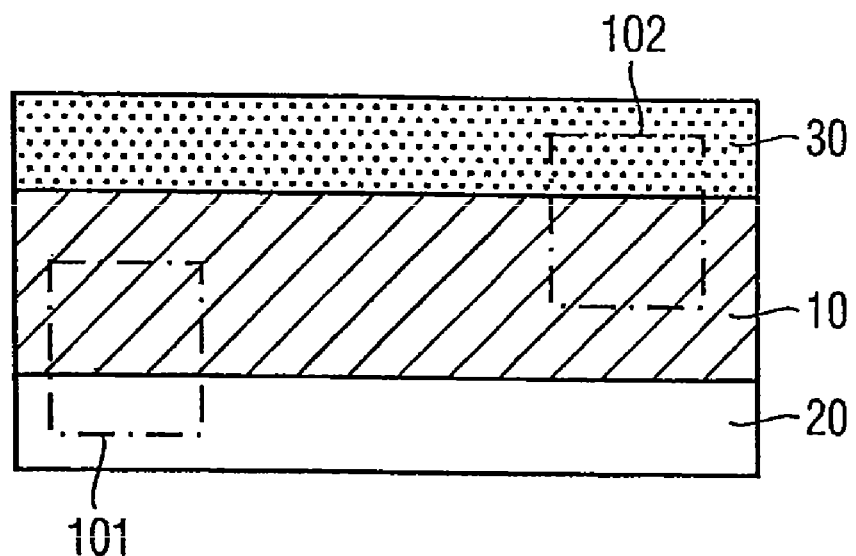
FIGS. 1A through 1C illustrate schematic views of a dielectric layer according to one or more embodiments.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Embodiments of the invention may generally be used with any type of integrated circuit. In one embodiment, the integrated circuits has at least one memory cell. The memory may be a circuit included on a device with other types of circuits. For example, the memory may be integrated into a processor device, memory controller device, or other type of integrated circuit device. Devices into which the memory is integrated may include system-on-a-chip (SOC) devices. In another embodiment, the memory may be provided as a memory device which is used with a separate memory controller device or processor device.

In both situations, where the memory is integrated into a device with other circuits and where the memory is provided as a separate device, the memory may be used as part of a larger computer system. The computer system may include a motherboard, central processor, memory controller, the memory, a hard drive, graphics processor, peripherals, and any other devices which may be found in a computer system. The computer system may be part of a personal computer, a server computer, or a smaller system such as an embedded system, personal digital assistant (PDA), or mobile phone.

In some cases, a device including the memory may be packaged together with other devices. Such packages may include any other types of devices, including other devices with the same type of memory, other devices with different types of memory, and/or other devices including processors and/or memory controllers. Also, in some cases, the memory may be included in a device mounted on a memory module. The memory module may include other devices including memories, a buffer chip device, and/or a controller chip device. The memory module may also be included in a larger system such as the systems described above.

In some cases, embodiments of the invention may be used with multiple types of memory or with a memory which is included on a device with multiple other types of memory. The memory types may include volatile memory and nonvolatile memory. Volatile memories may include static random access memory (SRAM), pseudo-static random access memory (PSRAM), and dynamic random access memory (DRAM). DRAM types may include single data rate (SDR) DRAM, double data rate (DDR) DRAM, low power (LP) DDR DRAM, and any other types of DRAM. Nonvolatile memory types may include flash memory, resistive RAM (RRAM), ferroelectric RAM (FeRAM), phase-change RAM (PRAM), electrically erasable programmable read-only memory (EEPROM), and any other types of nonvolatile memory.

FIG. 1A illustrates a schematic view of an arrangement with a dielectric layer, according to one embodiment. A dielectric layer 10 is arranged on a substrate 20, which may include a semiconductor substrate, a semiconductor substrate with electronic entities, an electrode, or a substrate with an electrode region or electrode layer. Electronic entities may include transistors, resistors, capacitors, diodes, conductors, insulators, light emitting diodes, semiconductor lasers, and/or light sensors. On the dielectric layer 10 there is arranged a cap layer 30, which may include a conductive region, an electrode region, or an electrode layer. The cap layer 30 may include an oxide, such as an aluminum oxide, a zirconium oxide, a silicon oxide or a mixture of these oxides. A thickness of the cap layer may be in a range of 0.1 to 20 nm.

The dielectric layer 10 may include a zirconium, zirconium oxide, hafnium, hafnium oxide, titanium, titanium oxide, silicon and/or silicon oxide. Furthermore, the dielectric layer 10 may include a dopant, which may include silicon, aluminum, titanium and/or hafnium. The substrate 20 may include a further electrode, such as a bottom electrode, which may include titanium nitride, tantalum nitride, tungsten nitride, niobium nitride, carbon, iridium, silicon, and/or ruthenium. A thickness of the electrode may be in a range of 2 nm to 20 nm.

The dielectric layer 10 may include a region or a domain which is in a tetragonal, in an orthorhombic, or in a cubic crystalline state. Furthermore, the entire dielectric layer 10 may be in a tetragonal, in an orthorhombic, or in a cubic crystalline state. In the case of a tetragonal crystal, two lattice constants a and b, being parallel to a first and to a second crystal direction, are equal, whereas the third lattice constant c, being parallel to a third crystal direction differs from a and b, hence $a=b \neq c$. In the case of an orthorhombic crystal, the three lattice constants a, b, and c, being parallel to the three crystal directions, differ from each other, hence $a \neq b \neq c$. In the case of a cubic crystal, the three lattice constants a, b, and c, being parallel to the three crystal directions, are equal, hence $a=b=c$. The crystal orientation may be defined relative to interfaces of the dielectric layer 10 to a substrate, to an electrode, or to a covering layer, such as the substrate 20, or the cap layer 30, respectively. Such interfaces may be comprised by the regions 101, 102.

The dielectric layer 10 may furthermore be stressed or may include a region or a domain which is stressed. A stressed dielectric layer 10 or a region or a domain thereof may be a compressed, strained, stretched, or expanded layer, region, or domain. Such stress may be stabilize a respective crystalline state, which would be absent without the stress at given composition, temperature, and or pressure.

The cap layer 30 may influence and/or allow a transition of a structural state of the dielectric layer 10, for example, a transition from an amorphous state to a crystalline state, from an amorphous state to a tetragonal crystalline state, from an amorphous state to a cubic state, from an amorphous state to an orthorhombic state, from a non-tetragonal crystalline state to a tetragonal crystalline state, from a non-cubic state to a cubic state, from a non-orthorhombic state to an orthorhombic state, from a tetragonal, orthorhombic, or cubic state to a non monoclinic lower symmetry state, and/or from a monoclinic crystalline state to a tetragonal crystalline state. In one embodiment, a transition of a structural state of the dielectric layer 10 may be influenced or initiated by using an anneal process.

Any of the dielectric layer 10 or the cap layer 30 may be composed from a plurality of sublayers during manufacturing. Any sublayer may differ from a preceding or subsequent sublayer by its chemical composition and/or the concentration of a dopant and/or its thickness and/or its manufacturing method and/or its crystalline structure. A plurality of sublayers may be indistinguishable from each other after an anneal process due to interdiffusion of the components of each layer and/or change of the crystalline structure of the layers.

A first intermediate layer may be arranged on the substrate 20. On the first intermediate layer there is arranged the dielectric layer 10, on which, in turn, a second intermediate layer may be arranged. On the second intermediate layer there is arranged the cap layer 30. In one embodiment, any of the first and/or the second intermediate layers may have a thickness between 0.1 nm and 5 nm.

The first intermediate layer may include a buffer layer, and/or an insulating layer, including, for example, silicon and/or one of the common insulating materials as they are known from the manufacturing of highly integrated devices. The second intermediate layer may include a metal gate, and, hence, may include a conductive material, such as titanium nitride, tantalum nitride, a midgap material, or a related conductive material. Any of the first and/or the second intermediate layers may improve the lattice mismatch or the sticking coefficient between subsequent layers.

Figure 1B:
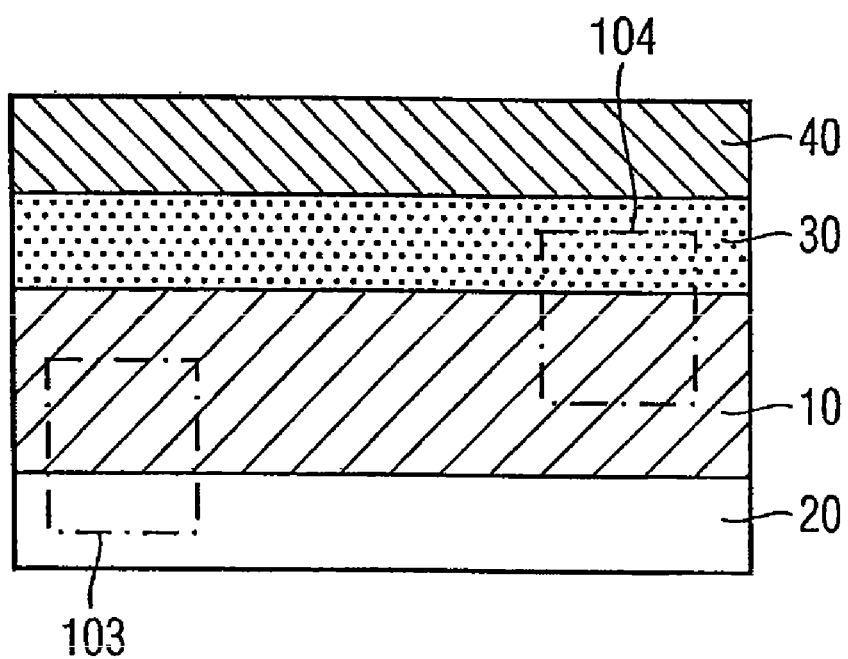

FIG. 1B illustrates a schematic view of an arrangement with a dielectric layer according to one embodiment, having the dielectric layer 10, the substrate 20, and the cap layer 30, as they have been described in conjunction with FIG. 1A.

According to one embodiment, there is arranged an electrode layer 40 on the cap layer 30. The electrode layer 40 may include titanium nitride, tantalum nitride, tungsten nitride, niobium nitride, carbon, iridium, silicon, and/or ruthenium. In one embodiment, a thickness of the electrode may be in a range of 2 nm to 20 nm. The electrode layer 40 may be used to apply an electric field in the dielectric layer 10 and/or the cap layer 30.

The electrode layer may form a capacitor together with a bottom electrode being part of the substrate 20 and the dielectric layer 10. The dielectric layer 10—or the dielectric layer 10 having a region or a domain—in one of the aforementioned crystalline states, may provide an enhanced dielectric constant, increasing the capacity of the capacitor. The dielectric layer 10 may provide a reduced leakage current, increasing the storage time of a capacitor. The dielectric layer 10 may be part of any type of capacitor, such capacitors including integrated capacitors, such as trench, stack, or planar capacitors, and discrete capacitors, such as discrete capacitor components.

Figure 1C:
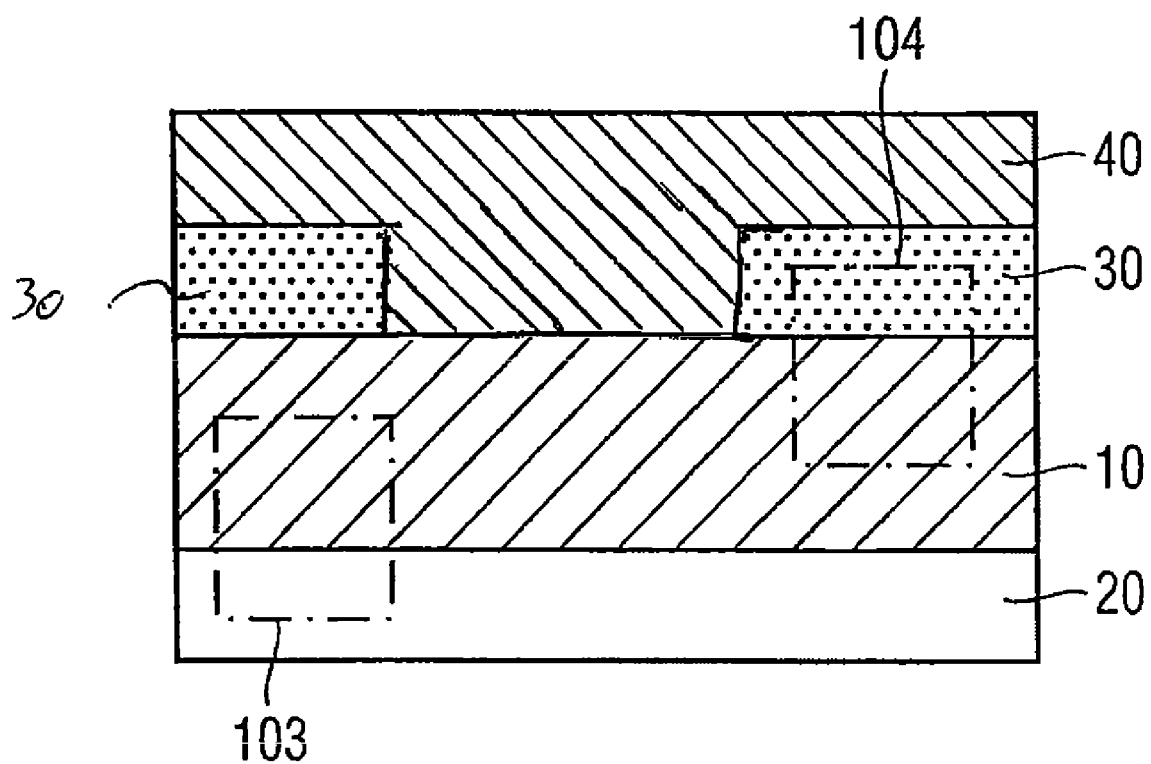

FIG. 1C illustrates a schematic view of an arrangement with a dielectric layer according to one embodiment, having the dielectric layer 10, the substrate 20, and the cap layer 30, as they have been described in conjunction with FIG. 1A.

The cap layer 30 provides openings which are obtainable by removing the cap layer 30 from predefined surface areas. In another embodiment, the cap layer may be deposited on predefined surface areas, thereby leaving other surface areas uncovered. Formation of the openings in the cap layer 30 may be done before or after the dielectric layer 10 has been subject to a transition of a structural state, for example, a transition from an amorphous state to a crystalline state, from an amorphous state to a tetragonal crystalline state, from an amorphous state to a cubic state, from an amorphous state to an orthorhombic state, from a non-tetragonal crystalline state to a tetragonal crystalline state, from a non-cubic state to a cubic state, from a non-orthorhombic state to an orthorhombic state, from a tetragonal, orthorhombic, or cubic state to a non monoclinic lower symmetry state, and/or from a monoclinic crystalline state to a tetragonal crystalline state.

According to one embodiment, there is arranged an electrode layer 40 on the cap layer 30. The electrode layer 40 may include titanium nitride, tantalum nitride, tungsten nitride, niobium nitride, carbon, iridium, silicon, and/or ruthenium. A thickness of the electrode may be in a range of 2 nm to 20 nm. The electrode layer 40 may be used to apply an electric field in the dielectric layer 10 and/or the cap layer 30. The electrode layer 40 may be arranged at least partly into the openings of the cap layer 30. The electrode layer 40 may thereby fill the openings fully or partly. The electrode layer may be limited to surface areas which are not covered by the cap layer 30.

The electrode layer may form a capacitor together with a bottom electrode being part of the substrate 20 and the dielectric layer 10. The dielectric layer 10—or the dielectric layer 10 having a region or a domain—in one of the aforementioned crystalline states, may provide an enhanced dielectric constant, increasing the capacity of the capacitor. The dielectric layer 10 may provide a reduced leakage current, increasing the storage time of a capacitor. The dielectric layer 10 may be part of any type of capacitor, such capacitors including integrated capacitors, such as trench, stack, or planar capacitors, and discrete capacitors, such as discrete capacitor components.

Figure 2:
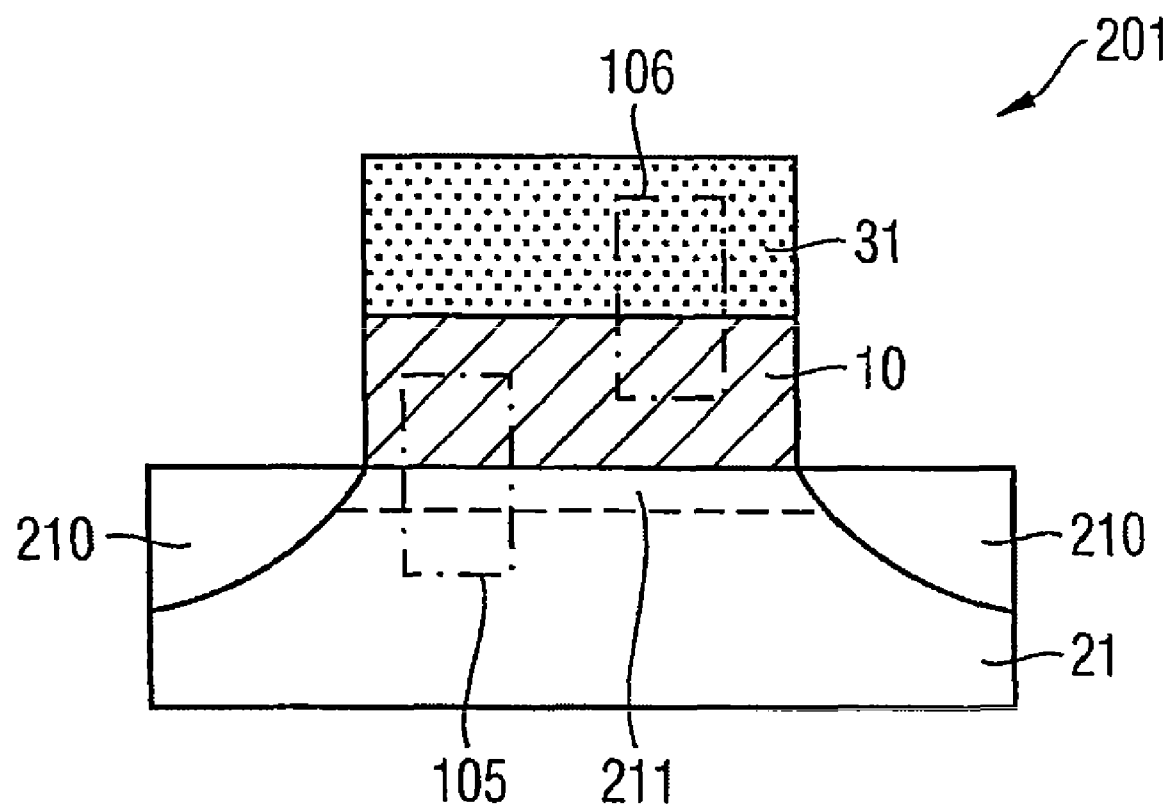
FIG. 2 illustrates a schematic view of an electronic entity having a dielectric layer according to one or more embodiments.

FIG. 2 illustrates a transistor having a dielectric layer, according to one embodiment. A transistor 201 is arranged on and in a substrate 21. The substrate 21 includes doped regions 210, such as source and or drain-regions. In the substrate 21 and between the doped regions 210 there is arranged a transistor channel 211. The dielectric layer 10 is arranged on a surface of the substrate 21 and separates an electrode 31, such as a gate electrode, from the transistor channel 211. The conductivity of the transistor channel 211 may be enhanced and/or depleted by applying a voltage at the electrode 31.

The dielectric layer 10 having one of the aforementioned crystalline structures or having a region or a domain in such a crystalline state may provide an enhanced dielectric constant, hence allowing for an optimized tuning of the transistor channel 211.

The transistor entity 201 may be a selection transistor of a memory device, such as a dynamic random access memory (DRAM). Furthermore, the transistor entity 201 may be a transistor of a logic circuitry, a microprocessor, a discrete field effect transistor, or a transistor of a logic entity of a memory device.

Figure 3A:
FIGS. 3A through 3D illustrate schematic views of a dielectric layer in various stages during manufacturing according to one embodiment.

FIGS. 3A through 3D illustrate schematic views of a dielectric layer in various stages during manufacturing, according to one embodiment. As illustrated in FIG. 3A, a substrate 20 is provided. The substrate 20 may include a semiconductor substrate, which, in turn, may include electronic and/or optic entities. The entities include transistor elements, capacitor elements, resistor elements, diode elements, light emitting elements, semiconductor laser elements, light sensor elements, and/or other electronic or optic entities as they are known from the technology of integrated device manufacturing. Furthermore, the substrate 20 may include a conductive region or an electrode. Such a conductive region or such an electrode may include titanium nitride, tantalum nitride, tungsten nitride, niobium nitride, carbon, iridium, and/or ruthenium. A thickness of the region or electrode may be in a range of 2 to 20 nm. A dielectric layer, for example the dielectric layer as described in the following, may be provided on such a conductive region and/or electrode.

Figure 3B:
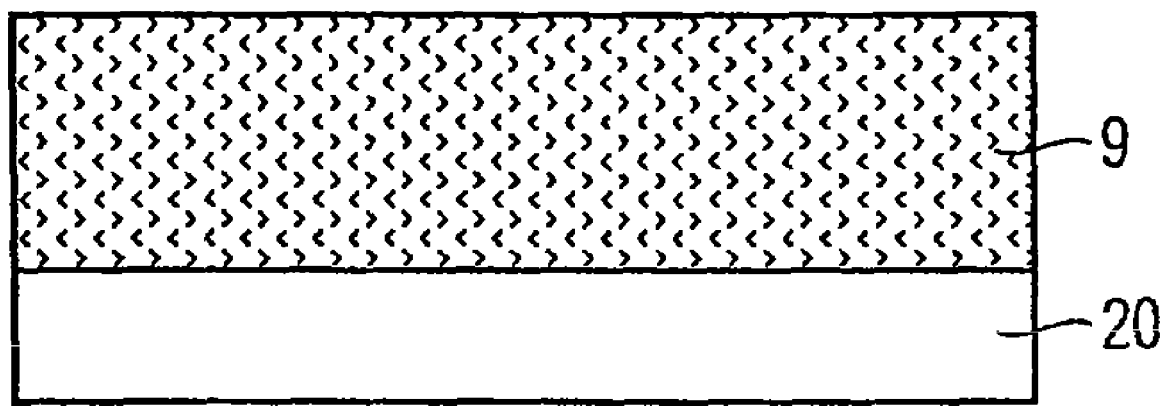

In another embodiment, as illustrated in FIG. 3B, a preliminary dielectric layer 9 is provided on the substrate 20. The preliminary dielectric layer 9 may be provided an atomic layer deposition (ALD), a metal organic atomic layer deposition (MOALD), a chemical vapor deposition (CVD), a metal organic chemical vapor deposition (MOCVD), or one of a related process. The preliminary dielectric layer 9 may include, zirconium, zirconium oxide, hafnium, hafnium oxide, titanium, titanium oxide, silicon, silicon oxide and/or oxygen. Furthermore, the preliminary dielectric layer 9 may include at least one dopant, which may be selected from the group of silicon, aluminum, and/or titanium. The preliminary dielectric layer 9 may include a compound such as hafnium-zirconium-oxide, i.e. $Hf_{(1-x)}Zr_xO_2$ or a quaternary compound such as hafnium-zirconium-silicon-oxide, i.e. $Hf_yZr_xSi_zO_{(1-x-y-z)}$. A dopant may be integrated into the compound interstitial, i.e. outside the crystalline structure or substitutional, i.e. on a regular position of the crystalline structure.

The preliminary dielectric layer 9 may include impurities resulting from the residual gas during the manufacturing process or impurities from the raw material used for the manufacturing of Furthermore, in one embodiment a layer thickness of the preliminary dielectric layer 9 may be in a range of 2 to 200 nm, in a range of 2 to 50 nm, or below 20 nm. However, the invention applies to a layer thickness which is outside of the ranges as well.

The preliminary dielectric layer 9 may have a crystallization temperature, at and above which the dielectric layer 9 undergoes a transition from an amorphous state to a crystalline state, from an amorphous state to a tetragonal crystalline state, from an amorphous state to a cubic state, from an amorphous state to an orthorhombic state, from a non-tetragonal crystalline state to a tetragonal crystalline state, from a non-cubic state to a cubic state, from a non-orthorhombic state to an orthorhombic state, from a tetragonal, orthorhombic, or cubic state to a non monoclinic lower symmetry state, and/or from a monoclinic crystalline state to a tetragonal crystalline state.

Initially, the preliminary dielectric layer 9 may be provided in an amorphous state. The crystallization temperature may be above 200° C., 350° C., 500° C. or above 750° C. The provision of the preliminary layer 9 may include a doping of the preliminary dielectric layer 9 with a dopant. The doping may be conducted in a separate process, for example, by an implantation, a diffusion, or an activation stage. Furthermore, the dopant may be provided in-situ, together with the remaining components of the dielectric layer. This may be effected by an atomic layer deposition (ALD, MOALD) process or a chemical vapour deposition process (CVD, MOCVD) using the appropriate precursors. The precursors may include titanium, aluminum, zirconium, hafnium, and/or silicon. The type and/or the concentration of the dopant may affect the crystallization temperature. In one embodiment, the crystallization temperature may be lowered by adding a dopant. The content of the dopant may be in a range between 0.1% to 50%. For example, a zirconium oxide layer may include 0.1% to 50% of silicon and/or hafnium and/or titanium and/or aluminum.

Figure 3C:
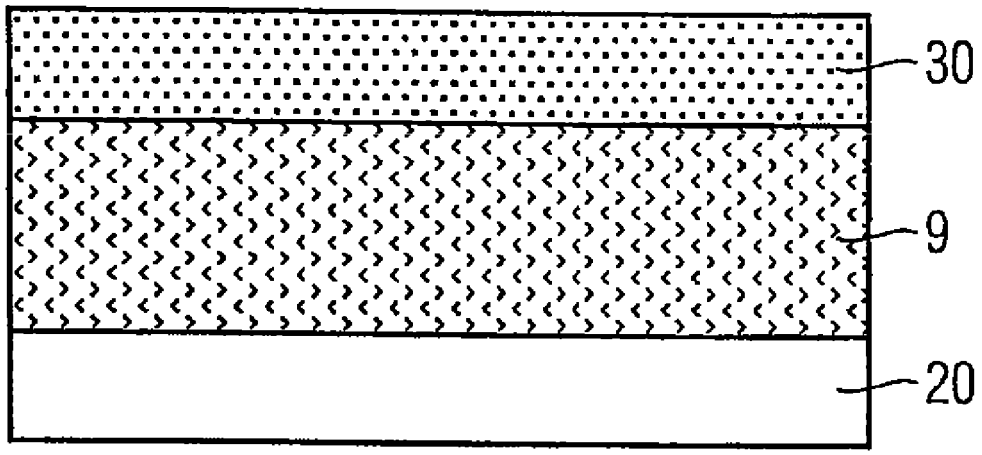
Figure 3D:
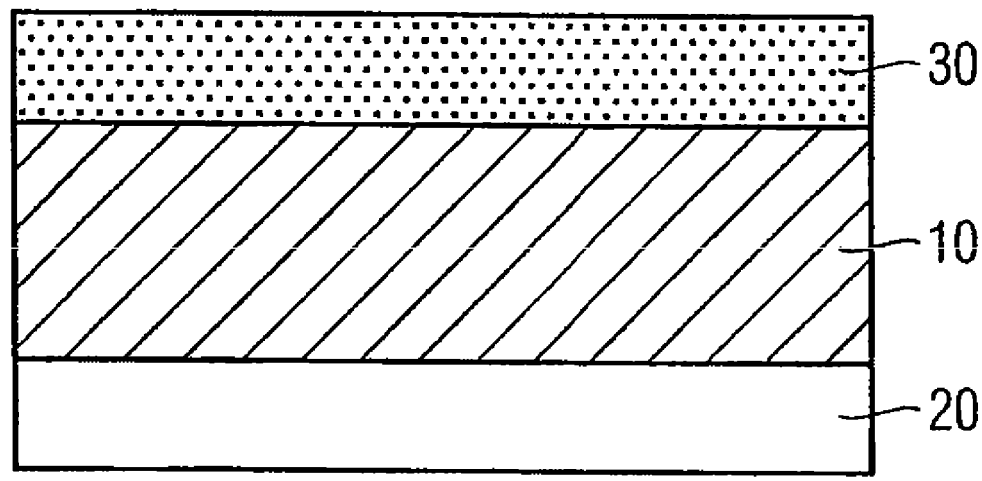

In another embodiment, as illustrated in FIG. 3C, the cap layer 30 is provided on the preliminary dielectric layer 9. The cap layer 30 may include a conductive region or a conductive material, and/or a dielectric material. The cap layer 30 may include titanium nitride, tantalum nitride, tungsten nitride, niobium nitride, carbon, iridium, silicon oxide, zirconium oxide and/or ruthenium. A thickness of the region or electrode may be in a range of 2 to 20 nm. The cap layer 30 may be provided at a first temperature, the first temperature being below the crystallization temperature of the preliminary dielectric layer 9. This first temperature may be below 200° C., below 750° C., below 500° C., or below 350° C. According to an embodiment, the first temperature may be equal or close to the crystallization temperature of the dielectric layer, which may induce a crystallization during the providing or deposition of the cap layer. The first temperature may, in such a case, 10 K below the crystallization temperature, 1 K below the crystallization temperature, or 0.1 K below the crystallization temperature.

In another embodiment, as illustrated in FIG. 5D, the arrangement of the dielectric layer 10 and the cap layer 30 is heated to a second temperature, the second temperature being equal to or greater than the crystallization temperature. In this way, the preliminary dielectric layer 9 is transferred into the dielectric layer 10, which includes the region or the domain in any of the aforementioned crystalline states. The heating may be effected as an anneal-stage, in which electronic and/or optic entities, which may have already been realized in or on the substrate 20, may be activated or functionalized. Furthermore, this anneal-stage may include a standard anneal-stage of a CMOS manufacturing process.

The dielectric constant of the dielectric layer 10 may further be a function of the content of the dopant of the dielectric layer 10. Selecting the composition of the dielectric layer 10 may further result in a desired orientation or crystallization or crystallization temperature. Furthermore, the dielectric constant may be a function of the crystalline state, and/or the tetragonality t. The crystalline state and the tetragonality t may be determined by selecting at least one appropriate dopant and a predetermined well-defined content. The dielectric layer 10 may illustrate an anti-ferroelectric effect. This effect may be linked to the presence and/or the constitution of a cap layer 30.

According to one embodiment, the cap layer 30 may induce mechanical stress on the preliminary dielectric layer 9, prior, during or after a phase transition of the preliminary dielectric layer 9. The stress may influence, allow, or support a transition of the state of the preliminary dielectric layer 9. The transition may be induced by heating the preliminary dielectric layer 9 and the cap layer 30 to the second temperature, the second temperature being equal or greater than the crystallization temperature. In this way, the preliminary dielectric layer 9 is transferred into the dielectric layer 10, which may include a region or a domain in any of the aforementioned crystalline states.

During such a transition stage and/or heating stage, the cap layer 30 may mechanically confine the preliminary dielectric layer 9 such that, during a phase transition at a well-defined process temperature, the preliminary dielectric layer 9 undergoes a phase transition to a desired crystalline state. Such a desired crystalline state may be any of the aforementioned crystalline states and may furthermore feature an enhanced dielectric constant or an anti-ferroelectric state, which, in turn, provides an electric dipole. Such a desired crystalline state may otherwise, i.e. without the cap layer 30, difficult or impossible to attain. A crystalline state may further include a desired orientation of the crystal lattice relative to an interface, an electrode, an electrode plane, or to an applied electric field.

It is noted, that the cap layer 30 may suffice for inducing a desired phase transition to a respective desired crystalline state. Nevertheless, a further stress inducing layer may be provided which is located at least on a part of the surface of the cap layer 30. A ready structure may also include the stress inducing layer. The stress inducing layer in this case may serve other purposes, such as conducting a current, applying a voltage, sinking heat, barring the diffusion of dopants, and/or sealing underlying entities from an environment. In another process, the stress inducing layer may nevertheless be removed.

According to one embodiment, a phase transition of a layer, a material, a compound material, or a section or a domain thereof is understood as a transition from a first state to a second state. The first state and the second state may include an amorphous state, a crystalline state, a tetragonal crystalline state, an orthorhombic crystalline state, a cubic crystalline state, a monoclinic crystalline state, or any combination thereof. The term crystalline is used in this context as to include mono-crystalline, poly-crystalline, or nano-crystalline. According to one embodiment, a phase transition is induced to reduce degradation, reduce twinning, reduce the formation of conductive grain boundaries, reduce the conductivity of grain boundaries, reduce leakage currents, and/or to increase the dielectric constant of a dielectric layer. Furthermore, according to one embodiment, a concentration of a dopant may be reduced while still attaining satisfying physical and dielectric properties.

According to one embodiment, the dielectric layer 10 may also include a region or a domain which is in an anti-ferroelectric state. In such a case, the crystalline state may be another crystalline state as those which have been described in conjunction with the aforementioned embodiments. Such a state may also include an amorphous, a monoclinic crystalline, or another crystalline state. Furthermore, the entire dielectric layer 10 may be anti-ferroelectric.

The orientation of the electric polarization of such a dielectric or oxide layer 10 in a ferroelectric state may be defined relative to interfaces to a substrate, to an electrode, or to a covering layer, such as the substrate 20, or the covering layer 13, respectively. An anti-ferroelectric state may be characterized in that the layer includes domains and/or sub-domains polarized with an opposite orientation such that to cancel out neighbouring dipole moments and, hence, having a vanishing overall polarization.

Figure 4:
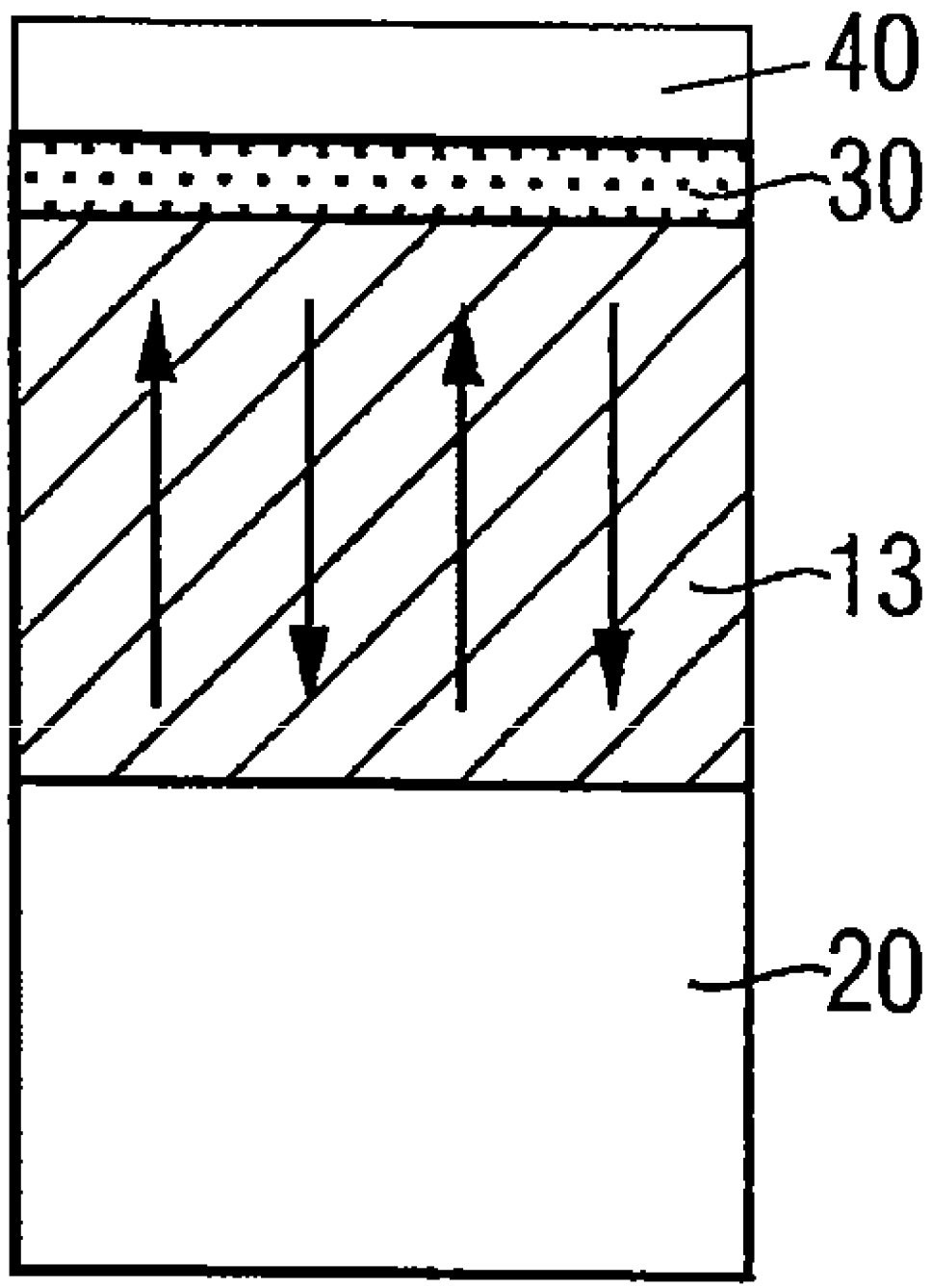
FIG. 4 illustrates schematic views of an oxide layer in an anti-ferroelectric state according to one embodiment.

FIG. 4 illustrates a schematic view of an oxide layer in an anti-ferroelectric state according to one embodiment. As illustrated in FIG. 4, there is an oxide layer 10 arranged on a substrate 20. On the oxide layer 10 there is arranged the cap layer 30. An electrode layer 40 may be optionally present. In one embodiment, the electrode layer 40 may be used as a stress inducing layer as well. It is to be noted here, that the above detailed description of the dielectric layer may as well apply to an oxide layer according to one embodiment, such as the oxide layer 10. Specifically, the methods of manufacturing of a dielectric layer, various arrangements of a dielectric layer, crystalline states and orientations of a dielectric layer, and components of a dielectric layer as described in conjunction with FIGS. 1A, 1B, 1C, 2, and 3A through 3D may as well apply to the oxide layer 10.

The dipole moments of the oxide layer 10 are arranged such that neighboring moments are oriented opposite to each other. In this way, neighboring dipole moments cancel out each other and the overall polarization of the oxide layer 10 basically vanishes. Such a state may be referred to as an anti-ferroelectric state of the oxide layer 10. Although an anti-ferroelectric material, such as the material of the oxide layer 10, may not provide a notable dipole moment to its environment, an anti-ferroelectric material may be still distinguished from a non-ferroelectric material, since an anti-ferroelectric material still possesses a dipole moment on a microscopic, crystallite or domain scale. Furthermore, an anti-ferroelectric material may provide no dipole moment to an environment, but because being still ferroelectric, may be switched to a ferroelectric state. It is to be noted that an oxide layer in an anti-ferroelectric state, such as the oxide layer 10, may be simultaneously in a cubic crystalline state.

The oxide layer 10 may include a domain in a ferroelectric state or may be, as a hole, in a ferroelectric state.

Figure 5:
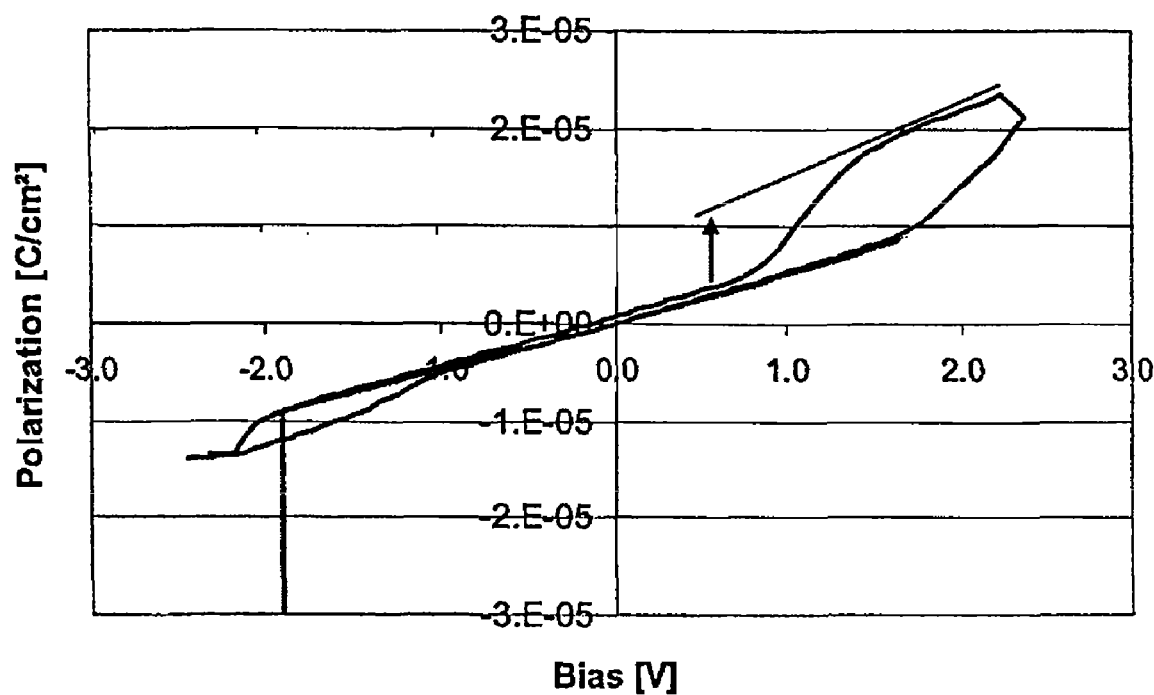
FIG. 5 illustrates for an oxide layer according to one embodiment the dependency of the polarization from the electric field applied.

FIG. 5 illustrates for a $ZrO_2$ layer 10 according to a one embodiment the dependency of the polarization from the electric field applied.

Polarization in the context of the invention is the vector field that expresses the density of permanent or induced electric dipole moments in the dielectric layer 10. The polarization vector P is defined as the dipole moment per unit volume. The norm of the polarization is given on the vertical axis in the unit Coulomb per square meters.

On the horizontal axis, a bias voltage applied to a substrate 20 or an electrode portion of a substrate 20 and a top electrode 40 is given. This bias voltage is a measure for the electric field applied to the oxide layer 10 in a given geometry, i.e. at a given thickness of that oxide layer 10.

As can be seen from FIG. 7, the polarization increases and decreases linearly with the bias voltage applied if the bias voltage is less than approx. 0.9 V. This means that the electric susceptibility is constant which applies for a dielectric material. Increasing the bias voltage and thereby the electric field in the oxide layer 10 further results in a disproportionately high increase of the polarization. This polarization gain is due to the formation of an anti-ferroelectric phase of the oxide material and allows the storage of additional charge on the capacitor which is formed by using the oxide layer 10, the cap layer 30 and the substrate 20 or an electrode portion of the substrate 20 and a top electrode 40.

When decreasing the bias voltage, the polarization of the oxide layer 10 illustrates a hysteresis and finally decreases to its original value when reaching the range of dielectric behavior again. This brake down of the anti-ferroelectric state results in the electric charge stored to flow towards one electrode. Therefore, this charge may be measured as a current flowing from or to that electrode respectively.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
a substrate having a first side and a second side; and
at least one dielectric layer, the dielectric layer comprising a zirconium oxide and at least one dopant selected from the group comprising hafnium and titanium and having a first side and a second side, wherein the first side of the dielectric layer is arranged at least on a subarea of the first side of the semiconductor substrate,
wherein the dielectric layer comprises at least a region which is in any of a tetragonal, a cubic and an orthorhombic phase.

2. The integrated circuit of claim 1, wherein the dielectric layer includes at least one dopant selected from the group comprising silicon or aluminum.

3. The integrated circuit of claim 1, wherein a cap layer is provided, the cap layer having a first side and a second side and the first side of the cap layer being arranged on the second side of the dielectric layer.

4. The integrated circuit of claim 3, wherein the cap layer comprises any of a silicon oxide and an aluminum oxide and a zirconium oxide.

5. The integrated circuit of claim 3, comprising wherein any of the dielectric layer and the cap layer comprises a plurality of sublayers.

6. The integrated circuit of claim 5, wherein any sublayer out of the plurality of sublayers comprises the same base material and a different dopant.

7. The integrated circuit of claim 1, wherein the dielectric layer is in an antiferroelectric state.

8. The integrated circuit of claim 1, comprising wherein the concentration of the dopants is in a range from 0.1%, up to 50%.

9. The integrated circuit of claim 1, comprising wherein the dielectric layer is part of a transistor or a capacitor.

10. The integrated circuit of claim 9, comprising wherein the transistor or the capacitor is part of a dynamic random access memory cell.

11. An integrated circuit comprising:
a substrate;
a cap layer;
at least one dielectric layer between the substrate assembly and the cap layer, the dielectric layer comprising:
a zirconium oxide and at least one dopant selected from the group comprising hafnium and titanium and having a first side and a second side, wherein the first side of the dielectric layer is arranged at least on a subarea of the first side of the semiconductor substrate,
wherein the dielectric layer is in an antiferroelectric state.

12. The integrated circuit of claim 11, wherein the cap layer comprises an electrode.

13. An integrated circuit comprising:
an electrode;
a substrate including doped regions; and
a transistor including at least one dielectric layer and a transistor channel, the transistor channel located in the substrate between the doped regions, the dielectric layer separating the electrode from the transistor channel, the dielectric layer comprising:
a zirconium oxide and at least one dopant selected from the group comprising hafnium and titanium and having a first side and a second side, wherein the first side of the dielectric layer is arranged at least on a subarea of the first side of the semiconductor substrate, and
wherein the dielectric layer is stressed.

14. The integrated circuit of claim 13, comprising a memory device, wherein the transistor is configured as a selection transistor.

* * * * *